United States Patent [19]
Tanaka et al.

[11] 4,367,442
[45] Jan. 4, 1983

[54] DISTORTION CORRECTION CIRCUIT FOR A POWER AMPLIFIER

[75] Inventors: Susumu Tanaka; Susumu Takahashi, both of Tokyo, Japan

[73] Assignee: Sansui Electric Co., Ltd., Tokyo, Japan

[21] Appl. No.: 168,188

[22] Filed: Jul. 10, 1980

[51] Int. Cl.³ .............................................. H03F 1/26
[52] U.S. Cl. ..................................... 330/149; 330/84; 330/146; 330/126; 330/295; 330/306
[58] Field of Search ................... 330/84, 124 R, 146, 330/149, 151, 126, 295, 302, 306

[56] References Cited

U.S. PATENT DOCUMENTS

| | | | |
|---|---|---|---|
| 3,725,727 | 4/1973 | Waehner | 330/126 X |
| 3,801,858 | 4/1974 | Grangaard et al. | 330/84 X |
| 3,970,953 | 7/1976 | Walker et al. | 330/149 X |

FOREIGN PATENT DOCUMENTS 55-66110  5/1980  Japan ................................ 330/151

*Primary Examiner*—James B. Mullins

[57] ABSTRACT

An amplifying device comprising a pre-amplifier, a first high power amplifier of a relatively bad linearity for amplifying the outputs of the pre-amplifier, a first impedance element for applying the outputs of the first amplifier to a load, a negative feedback circuit for feeding back the outputs of the first amplifier to the input of the pre-amplifier and a second low power amplifier of the relatively good linearity for amplifying the inputs of the first amplifier and supplying the outputs through a second impedance element to the load. The amplifying device can cancel the distortion in the high frequency band caused in the first amplifier through the first and second impedance elements by the outputs of the first amplifier.

18 Claims, 18 Drawing Figures

$X_1(s) =$ $X_0(s) =$ $\Rightarrow X_0(s) \doteqdot$

DISTORTION CORRECTION CIRCUIT FOR A POWER AMPLIFIER

The present invention relates to an amplifying device and, more particularly, an amplifying device mainly employed in the audio-frequency power amplifiers.

Generally speaking, when the power amplification stage comprising power transistors is operated for the Class B or AB configuration, large distortion is caused. A large amount of negative feedback is effected in the modern audio-frequency amplifiers to reduce such distortion. Since the output of the amplifier is fed back through the negative feedback circuit to the input thereof, signals pass through the amplifier many times to make the amplifying circuit unstable. In order to avoid this, the amount of feedback in the high frequency band is reduced using the phase compensating circuit. As the result, the distortion caused in the amplifier in the high frequency band becomes larger as the amount of feedback reduces. On the other hand, the switching distortion of the transistors, for example, is more often caused as approaching toward the high frequency band. Therefore, the distortion in the high frequency band becomes worse quickly in the amplifier intended to effect negative feedback.

The feedforward technique is well known to reduce the distortion. As disclosed in FIG. 1, the input signal is supplied to the pre-amplifier 2 through the input terminal 1, the outputs of the preamplifier are applied to the high power amplifier 3, the outputs of the high power amplifier are negatively fed back through the negative feed back circuit 5 to the input of the pre-amplifier 2, and the distortion components contained in the inputs of the high power amplifier 3 are added through the amplifier 4 of current type to between the impedance element 6 connected to the output terminal of the high power amplifier 3 and the load 7 to thereby try to cancel the distortion of the high power amplifier. However, the conventional example shown in FIG. 1 can not remove the distortion appearing in the high frequency band of the outputs of the high power amplifier 3. In addition, because the high power amplifier 3 which is to be compensated by the outputs of the current amplifier 4 is of voltage type, it is necessary that the output compensation current of the amplifier 4 should become large when the impedance of the load becomes small. However, because the amplifier 4 employed in the conventional amplifying device is of current type, a constant amount of current is allowed to flow out and the impedance changes of the load comprising speakers and the like can not be followed by the output current of the amplifier 4. Therefore, the conventional example shown in FIG. 1 can not be successful in satisfactorily cancelling the distortion contained in the outputs of the high power amplifier.

As also disclosed in FIG. 2 of the U.S. Pat. No. 3,970,953, the first and second amplifiers (12), (13) are connected in a cascade configuration, the outputs of the second amplifier (13) are fed back to both inputs of the first and second amplifiers (12), (13), and the inputs of the second amplifier (13) are added through the first resistance (16) to between the load (15) and the second resistance (14) connected to the output of the second amplifier (13). This device has such a precondition to cancel the distortion that circuit elements are selected so as to meet the bridge balance. The distortion having the secondary characteristic (12 dB/OCT) in the practical amplifier can not be cancelled by the primary characteristic (6 dB/OCT) in the bridge balance circuit of the example of this reference. It is well known that the practical amplifying device has such a feature that the gain lowers at the rate of more than 6 dB/OCT, for example, 12 dB/OCT depending on the influences such as stray capacity and input capacity of each of circuit elements when considering the general characteristic of the device. On the contrary, only resistances (16), (14) are connected between the input of the second amplifier (13) and the load (15) and between the output of the second amplifier (13) and the load (15), respectively, in the second embodiment disclosed in the above-mentioned U.S. Patent and the frequency characteristic is left out of consideration in the course of compensating the distortion contained in the output signals of the second amplifier (13). Since the third embodiment shown in FIG. 3 of this U.S. Patent has an inductance (14) connected between the output of the second amplifier (13) and the load (15), and a resistance (16) connected between the input of the second amplifier (13) and the load (15), the signal for compensating the distortion caused in the second amplifier (13), that is, the feedforward amount only correlatively increases at the rate of 6 dB/OCT. Therefore, none of the embodiments disclosed in this U.S. Patent can compensate the gain characteristic of lowering at the rate of 12 dB/OCT in the high frequency band, or the distortion characteristic of increasing at the rate of 12 dB/OCT in the high frequency band, which are usually seen in the practical amplifying device. Namely, the feedforward effect on signal frequency can be achieved only at a point of frequency at which the characteristic curves of 12 dB/OCT and 6 dB/OCT cross each other, but not relative to frequencies excluded from this point, and the distortion compensating effect is almost not achieved particularly in the high frequency band.

Further, it is necessary for the purpose of meeting the condition of the bridge balance that the gain of the amplifier is infinite, but only finite gain is obtained practically. Considering that the first and second amplifiers (13), (14) are a unit amplifier, current large enough to cancel the distortion can not be derived because current is derived from inside the amplifier and added through the first resistance (16) to the load (15). In addition, the influence of the load (15) is effected into the second amplifier (13) because the outputs of the second amplifier (13) are added to the input of the second amplifier (13) through the resistance (16), causing this amplifier not to be operated correctly. Namely, when the load resistance becomes small, the current directly added to the load from the input of the second amplifier (13) via the first resistance (16) becomes large while the input current of the second amplifier (13) becomes small, thus making it difficult to obtain enough output current from the second amplifier (13). Further, when the gain of the second amplifier (13) is larger than one, oscillation is created through the positive feedback circuit including the first resistance (16).

It is therefore an object of the present invention to provide an amplifying device capable of lowering the increase of the distortion in the high frequency band caused in the negative feedback amplifier and reducing the distortion over a wide frequency range.

It is another object of the present invention to provide an amplifying device capable of completely eliminating even the distortion which is regarded as the secondary or more characteristic and which does not use the technique of cancelling the distortion by the bridge balance circuit.

According to the present invention, an amplifying device is provided comprising a pre-amplifier, a first amplifier for amplifying the outputs of the pre-amplifier and applying them through a first impedance element to a load, a negative feedback circuit for feeding back the outputs of the first amplifier to the input of the preamplifier, and a second amplifier to which the inputs of the first amplifier are given and for supplying the output signals via a second impedance element to the load to cancel the distortion caused in the first amplifier.

The invention will now be described, by way of example, with reference to the accompanying drawings, in which.

Figure 1:
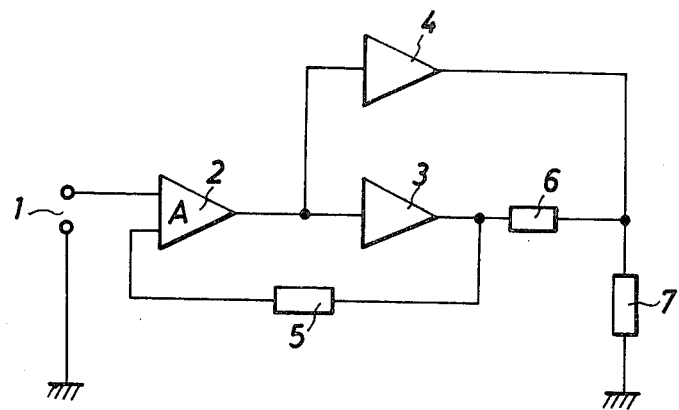
FIG. 1 is a block diagram showing a prior art amplifying device.
Figure 2:
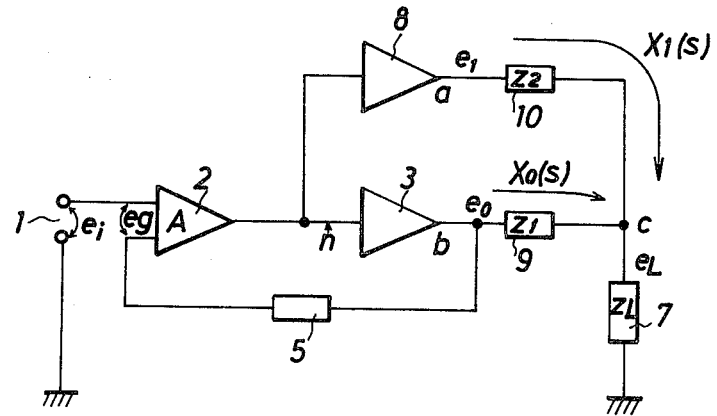
FIG. 2 is a block diagram showing an embodiment of the present invention.

In FIG. 2 in which an embodiment of the present invention is shown, numeral 1 represents an input terminal to which signals to be amplified are applied, 2 a phase compensated pre-amplifier to the noninversion input of which signals to be amplified are delivered from the input terminal 1 and capable of reducing the amplification degree in the high frequency band so as to attain stable negative feedback, 3 a high power amplifier serving to amplify the outputs of the pre-amplifier 2 and having no good linear characteristic to cause relatively high distortion, and 8 a low power amplifier serving to amplify the outputs of the pre-amplifier 2 and having good linear characteristic to cause relatively low distortion. A negative feedback circuit 5 is inserted between the output of the high power amplifier 3 and the inversion input of the pre-amplifier 2. The output of the high power amplifier 3 is connected to a load 7 through a first impedance element 9 while the output of the low power amplifier 3 similarly to the load 7 through a second impedance element 10.

The cancellation of distortion and noise components caused by the high power amplifier 3 will be now described using a feedforward system in the arrangement as described above. Conditions under which no distortion caused by the high power amplifier 3 appears at the load terminal will be calculated from the following equations. Assume that the amplification degree of the amplifiers 3 and 8 is made one for the clarity of description.

An equation (1) is established on the pre-amplifier 2 and the high power amplifier 3 shown in FIG. 2.

$$e_i = e_g + b e_o \quad (1)$$

wherein $e_i$ represents an input signal voltage, $e_g$ an input voltage of the pre-amplifier 2, b a constant of the negative feedback circuit 5, and $e_o$ an output voltage of the high power amplifier 3. An equation (2) will be gained from the equation (1).

$$e_g = e_i - b e_o \quad (2)$$

And an equation (3) will be gained, too.

$$e_o = n + A e_g \quad (3)$$

wherein n represents distortion and noise components caused by the high power amplifier 3, and A the amplifying rate of the pre-amplifier. An equation (4) will be obtained from the equations (2) and (3).

$$e_o = n + A(e_i - b e_o) \quad (4)$$

And equations (5) and (6) will be obtained from the equation (4).

$$(1 + Ab)e_o = n + A e_i \quad (5)$$

$$e_o = \frac{n + A e_i}{1 + Ab} \quad (6)$$

Providing that the distortion and noise components contained in the output voltage $e_o$ are represented by $e_{on}$, an equation (7) will be gained.

$$e_{on} = \frac{n}{1 + Ab} \quad (7)$$

No distortion and noises are caused by the low power amplifier 8 and the output voltage $e_1$ of the amplifier 8 is equal to the input voltage of the high power amplifier 3. Therefore, $$e_l = e_o - n \quad (8)$$

Equations (9) and (10) will be obtained from these equations (6) and (8).

$$e_1 = \frac{n + A e_i}{1 + Ab} - n \quad (9)$$

$$= \frac{-Abn + A e_i}{1 + Ab} \quad (10)$$

Accordingly, an equation (11) will be gained providing that the distortion and noise components contained in the output voltage $e_l$ are represented by $e_{ln}$.

$$e_{1n} = \frac{-Abn}{1 + Ab} \quad (11)$$

The distortion components $e_{on}$ and $e_{ln}$ respectively contained in the output voltages of the high and low power amplifiers 3 and 8 are inverse in phase and different in voltage. When the output voltages $e_o$ and $e_l$ of the high and low power amplifiers 3 and 8 are applied through their respective impedance elements 9 and 10 having impedances $Z_1$ and $Z_2$, respectively, to the load 7 having an impedance $Z_L$, the conditions under which the distortion and noise components $e_{on}$ and $e_{ln}$ are cancelled with each other not to appear at the load terminal voltage $e_L$ will be given by the following equation (12):

$$\frac{n}{1+Ab} \times \frac{Z_2//Z_L}{Z_1 + Z_2//Z_L} + \frac{-Abn}{1+Ab} \times \frac{Z_1//Z_2}{Z_2 + Z_1//Z_L} = 0 \quad (12)$$

wherein $Z_1//Z_L$ is equal to $$\frac{Z_1 \times Z_L}{Z_1 + Z_L}$$

and $Z_2//Z_L$ to $$\frac{Z_2 \times Z_L}{Z_2 + Z_L}.$$

Therefore, from the equation (12) will be obtained equations (13) and (14).

$$\frac{Z_2//Z_L}{Z_1 + Z_2//Z_L} = Ab \cdot \frac{Z_1//Z_2}{Z_2 + Z_1//Z_L} \quad (13)$$

$$Ab = \frac{Z_2//Z_L}{Z_1 + Z_2//Z_L} \cdot \frac{Z_2 + Z_1//Z_L}{Z_1//Z_L} \quad (14)$$

Namely, when the loop gain $Ab$ and the impedances $Z_1$, $Z_2$ and $Z_L$ are adjusted so as to meet the equation (14), an output containing no distortion can be gained as the load terminal voltage $e_L$. It is necessary to accurately adjust the voltages and phases using a series circuit comprising a coil or a coil and resistance as the impedance element 9 to which the outputs of the high power amplifier 3 are applied while using a series or parallel circuit including a resistance provided with a capacitance or a resistance as the impedance element 10 to which the outputs of the low power amplifier 8 are applied.

The above relates to the basic technical concept of the present invention, and a practical summing circuit comprising the impedance elements 9 and 10 will be now described.

Figure 3:
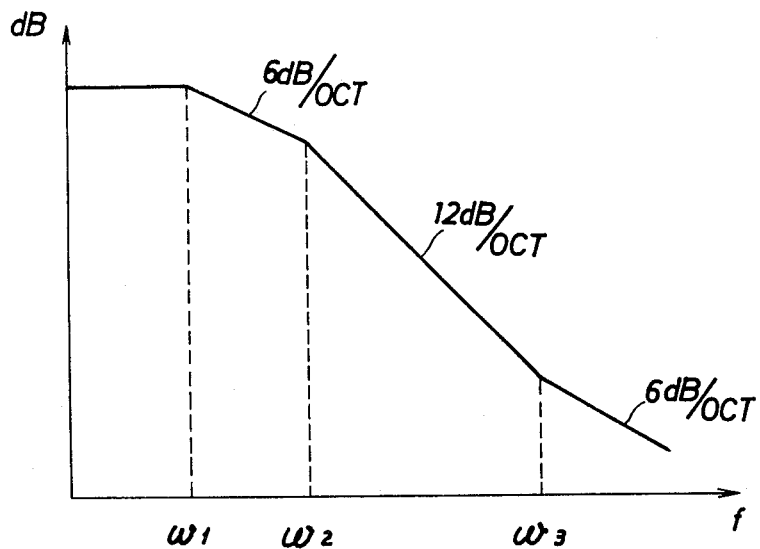
FIG. 3 represents a gain-frequency characteristic diagram of a pre-amplifier used in the present invention.

In the case of a pre-amplifier whose gain lowers at the rate of 12 dB/OCT in the high frequency band, the transfer function $A(s)$ of the pre-amplifier is expressed as follows:

$$A(s) = \frac{(s + \omega_3)}{(s + \omega_1)(s + \omega_2)} \cdot \frac{\omega_1 \omega_2}{\omega_3} \cdot A_o \quad (15)$$

wherein $A_o$ represents the amplifying rate of the preamplifier. An example of the gain-frequency characteristic of the pre-amplifier expressed by the transfer function $A(s)$ is as shown in FIG. 3. The gain decreases at the rate of 6 dB/OCT between $\omega_1$ and $\omega_2$ and it lowers at the rate of 12 dB/OCT between $\omega_2$ and $\omega_3$. This is approximate to the characteristic of the practical preamplifier.

The practical summing circuit will be described in the case of including a pre-amplifier whose transfer function is expressed by the equation (15).

Providing that the transfer function from a to c is denoted by $X_1(s)$ and that the transfer function from b to c by $X_o(s)$ in FIG. 2, conditions under which the distortion created in the high power amplifier 3 is made zero at the load terminal c by the feedforward operation will be expressed by the following equation (16).

$$e_{ln}X_1(s) + e_{lo}X_o(s) = 0 \quad (16)$$

Then, the equation (12) will lead to equations (17) and (18).

$$\frac{-A(s)bn}{1+A(s)b} \times X_1(s) + \frac{n}{1+A(s)b} \times X_o(s) = 0 \quad (17)$$

$$\therefore \frac{X_o(s)}{X_1(s)} = A(s)b \quad (18)$$

Therefore, $$\frac{X_o(s)}{X_1(s)} = \frac{(s + \omega_3)}{(s + \omega_1)(s + \omega_2)} \cdot \frac{\omega_1 \omega_2}{\omega_3} \cdot A_o b \quad (19)$$

Figure 4:
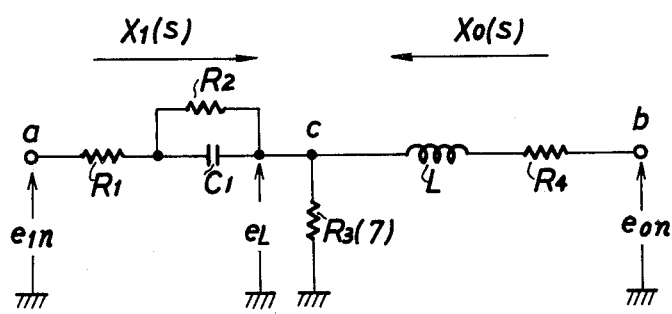
FIG. 4 is a view of a summing circuit employed in the embodiment of the present invention shown in FIG. 2.

The impedances $Z_1$ and $Z_2$ which meet the equation (19) can be approximately obtained by a circuit shown in FIG. 4. Namely, between the output terminal a of the low power amplifier 8 and the terminal c of the load $R_3$ (7) are connected in series a resistance $R_1$ and a parallel circuit including a resistance $R_2$ and a capacitance $C_1$, while between the terminal c and the output terminal b of the high power amplifier 3 an inductance L and a resistance $R_4$.

There will be now described the manner of determining the values of the impedances $Z_1$ and $Z_2$ by calculating $X_1(s)$ and $X_o(s)$, based on the circuit of FIG. 4.

Figure 5A:
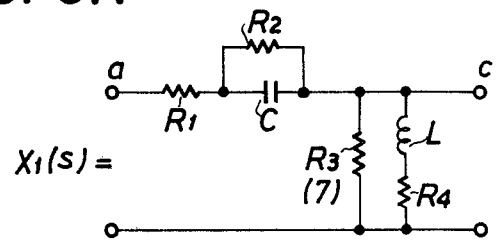
FIGS. 5A, 5B and 5C are circuit diagrams for obtaining the transfer functions of the summing circuit.

$X_1(s)$ may be derived from calculating the transfer function in FIG. 5A, by connecting the input terminal of the circuit of FIG. 4 to the earth.

$$X_1(s) = \frac{\frac{R_3(R_4 + sL)}{R_3 + R_4 + sL}}{R_1 + \frac{R_2}{1 + sCR_2} + \frac{R_3(R_4 + sL)}{R_3 + R_4 + sL}} \quad (20)$$

Generally speaking, the following will be established in the practical amplifier.

$$R_1 << R_2, R_4 << R_3, R_3 << R_2 \quad (21)$$

Therefore, the equation (20) will be arranged as follows.

$$X_1(s) = \frac{(1 + sCR_2)\left(1 + \frac{sL}{R_4}\right)}{(1 + sCR_1)\left(1 + \frac{sL}{R_3}\right)} \cdot \frac{R_4}{R_2} \quad (22)$$

Providing now that the following are established, $$\omega_a = \frac{R_4}{L}, \omega_b = \frac{1}{CR_2}, \omega_c = \frac{1}{CR_1}, \omega_d = \frac{R_3}{L} \quad (23)$$

then, $$X_1(s) = \frac{(s + \omega_a)(s + \omega_b)}{(s + \omega_c)(s + \omega_d)} \cdot \frac{\omega_c \omega_d}{\omega_a \omega_b} \cdot \frac{R_4}{R_2} \quad (24)$$

Figure 5B:
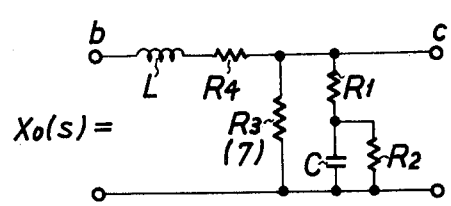
Figure 5C:
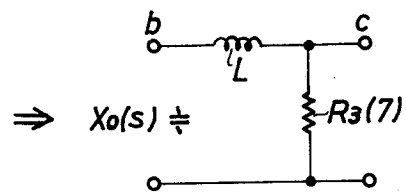

$X_o(s)$ will be now derived from calculating the transfer function in FIG. 5B by short-circuiting the terminal a of the circuit of FIG. 4. FIG. 5B can be approximated by an equivalent circuit shown in FIG. 5C under the condition of the equation (21).

$$X_o(s) = \frac{R_3}{sL + R_3} = \frac{\omega_d}{s + \omega_d} \quad (25)$$

An equation (26) will result from equations (24) and (25).

$$\frac{X_o(s)}{X_1(s)} = \frac{\omega_a}{(s + \omega_a)} \cdot \frac{(s + \omega_c)(s + \omega_d)}{(s + \omega_a)(s + \omega_b)} \cdot \frac{\omega_a \omega_b}{\omega_c \omega_d} \cdot \frac{R_2}{R_4} = \quad (26)$$

$$\frac{(s + \omega_c)}{(s + \omega_a)(s + \omega_b)} \cdot \frac{\omega_a \omega_b}{\omega_c} \cdot \frac{R_2}{R_4}$$

Since the equation (26) is same as the equation (19), the following will be established.

$$\omega_1 = \omega_a = \frac{R_4}{L}, \omega_2 = \omega_b = \frac{1}{CR_2}, \omega_3 = \omega_c = \frac{1}{CR_1}, \quad (27)$$

$$A_{on} = \frac{R_2}{R_4}$$

Accordingly, $R_1$, $R_2$, $R_4$, L and C can be determined when the loop gain $A_o b$ of the amplifier is selected.

As the result, the impedance elements which can satisfy the equation (16) can be determined to make zero the distortion at the point c.

Figure 6A:
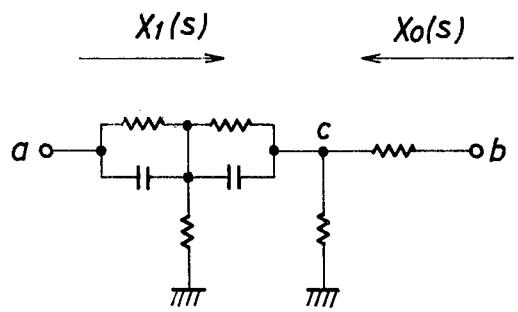
FIGS. 6A, 6B, 6C and 6D are circuit diagrams of other embodiments of the summing circuit of the invention.
Figure 6B:
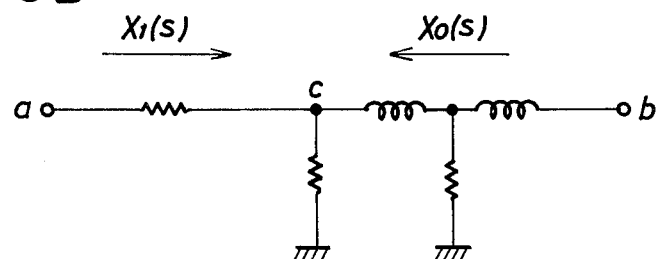
Figure 6C:
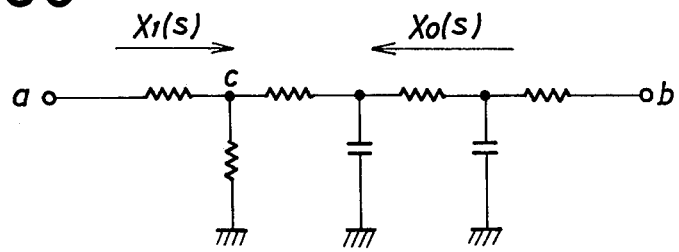
Figure 6D:
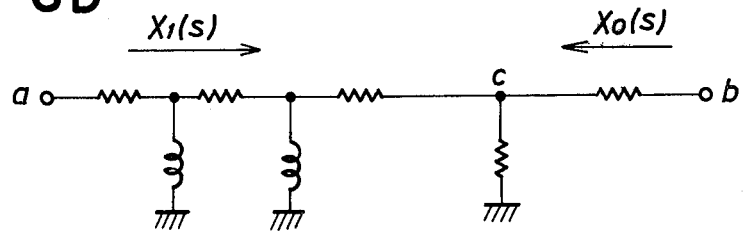

The summing circuit arranged as shown in FIGS. 6A to 6D can attain same effect. In FIG. 6A, two capacitors are connected between the terminals a and c. In FIG. 6B, two inductors are connected between the terminals b and c. In FIG. 6C, two capacitors are connected between the terminals b and c. In FIG. 6D, two inductors are connected between the terminals a and c. The summing circuit may be arranged in such a way that the transfer functions from point a to point c and from point b to point c, i.e. the impedances $z_2$ and $z_1$ have the frequency characteristic difference of 12 dB/OCT.

When the input signal is added through the preamplifier 2 to the high power amplifier 3 in the embodiment shown in FIG. 2, distortion is caused in the high power amplifier 3. The output signal containing such distortion is fed back through the feedback loop 5 to the input of the pre-amplifier 2. This fed-back signal is compared with the input signal to extract a distortion signal. In this case, the distortion signal, negatively fed back, becomes inverse in polarity and is applied to the input of the high power amplifier 3 after being amplified by the pre-amplifier 2. Since the distortion signal inverted in polarity by the action of negative feedback is given to the high power amplifier 3 the distortion contained in the output of the high power amplifier 3 is improved. As shown in FIG. 3, however, the gain-frequency characteristic of the outputs of the pre-amplifier 2 is of such nature that it lowers at the rate of 12 dB/OCT in the high frequency band. Thus, the output in the high frequency band of the high power amplifier 3, when fed back, reduces in the amount thereof to thereby increase the distortion in the high frequency band. The distortion component added, inverse in polarity, to the input of the high power amplifier 3 is taken up by the low power amplifier 8. The output distortion signals of the low power amplifier 8 have a flat frequency characteristic. In the summing circuit shown in FIG. 4, the output distortion signals of the amplifier 8 increase at the rate of 6 dB/OCT and the output signals of the amplifier 3 decrease at the rate of 6 dB/OCT, with the result that both signals have the characteristic difference of 12 dB/OCT. Thus, the distortion components of the output signals of the amplifier 3 which, in the high frequency band, tend to increase in the rate of 12 dB/OCT can be cancelled. In case that the summing circuits shown in FIGS. 6A to 6D are employed, the distortion components of the outputs of the amplifier 3 and the distortion outputs of the amplifier 8 are cancelled through the summing circuits.

According to the embodiment of the present invention as described above, the impedances $Z_1$ and $Z_2$ of the impedance elements 9 and 10 of the summing circuit are selected to enable the distortion component of the outputs of the high power amplifier 3 to be cancelled by the distortion outputs of the low power amplifier 8, thereby making zero the distortion contained in the high frequency band of the outputs of the high power amplifier 3 as well as the distortion contained in the low frequency band thereof. The distortion having the frequency characteristic of 12 dB/OCT or more can be eliminated. In the frequency range in which the negative feedback operation is employed, for example, in the range from 0 to 1 MHz, the distortion of the high power amplifier is completely removed. It is clear that the frequency range in which the distortion is removed can increase much more than 1 MHz depending on the construction of the amplifying device. Therefore, the embodiment enables the distortion components to be eliminated in a wide frequency range.

As far as the summing circuit is arranged to meet the equation (18) approximately, it can achieve same effect as those attained by the above-described embodiment of the present invention.

Further the low power amplifier 8 employed in the present invention is of voltage type. Therefore, when the impedance of the load 7 becomes low, the output compensation signals applied from the low power amplifier 8 increase to accurately cancel the distortion contained in the output signals of the high power amplifier 3. Since the amplifier 8 is interposed between the output and input of the amplifier 3, the output signal of the amplifier 3 is not positively fed back to the input thereof. Therefore, stable operation is achieved without causing oscillation even if the gain of the amplifier 3 is more than one. In addition, even if the impedance of the load 7 becomes low, no influence is given, thanks to the amplifier 8 connected, to the input of the amplifier 3, thus enabling the amplifier 3 to attain normal amplification. Since the bridge balance is not employed in the present invention, it is unnecessary for the gain of the pre-amplifier to be infinite, and accurate cancellation of distortion can be achieved using the amplifier whose gain is finite.

Figure 7:
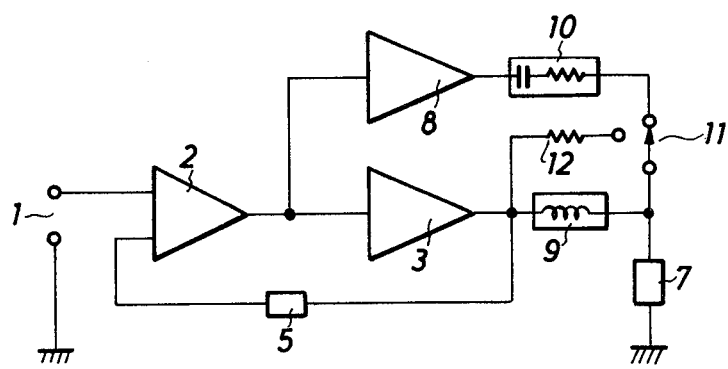
FIGS. 7 and 8 are circuit diagrams showing other embodiments of the present invention.

FIG. 7 shows a variation of the amplifying device shown in FIG. 2 in which a switch 11 is inserted between the impedance element 10 for the outputs of the low power amplifier 8 and the load 7, thus enabling the outputs of the low power amplifier 8 to be shut off and the circuit to serve only as the negative feedback amplifying circuit of the high power amplifier 3. A resistance 12 may be connected parallel to the impedance 9 for the outputs of the high power amplifier 3 so as to damp Q of the coil which is used as the impedance 9.

Figure 8:
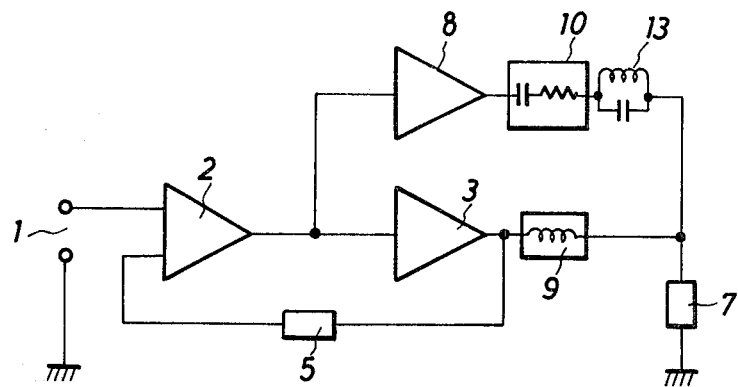

As shown in FIG. 8, a parallel resonance circuit 13 comprising an inductance and capacitance may be connected in series to the impedance element 10 for the outputs of the low power amplifier 8 to thereby increase the distortion compensating signals in desired frequencies.

Figure 9:
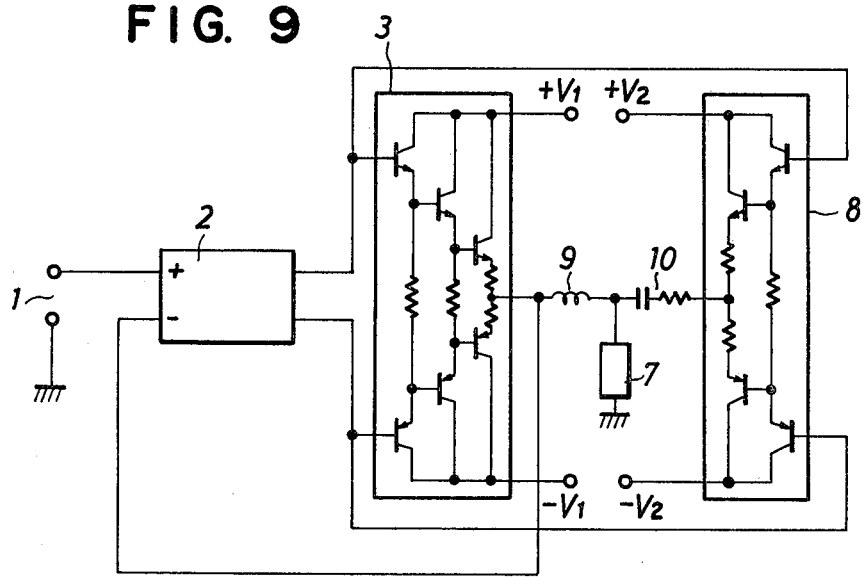
FIGS. 9 and 10 are circuit diagrams materializing the embodiments of the present invention.
Figure 10:
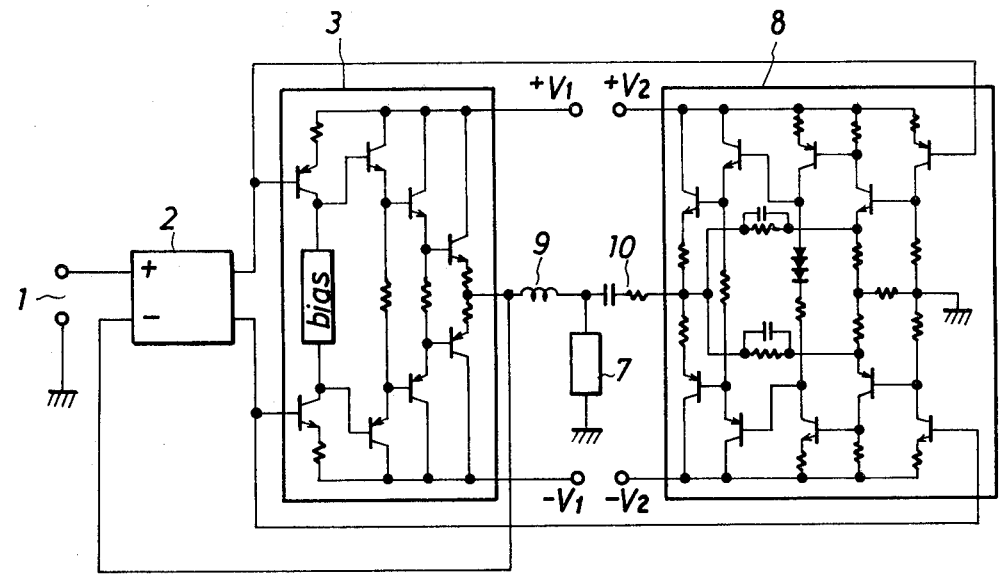

FIGS. 9 and 10 show circuit arrangements materializing the embodiment of the present invention shown in FIG. 2. In FIG. 9, the high power amplifier 3 comprises a Darlington connection of three stages and the low power amplifier 8 includes the Darlington connection of two stages. In FIG. 10, the low and high power amplifiers 8 and 3 have the gains. High voltages $\pm V_2$ supplied from power sources different from those of the high power amplifier 3 are supplied to the low power amplifier 8 to cause each of the circuits to be operated in low distortion, thus enabling general characteristics to be improved effectively. It is clear that both amplifiers may be driven by the same power source.

Figure 11:
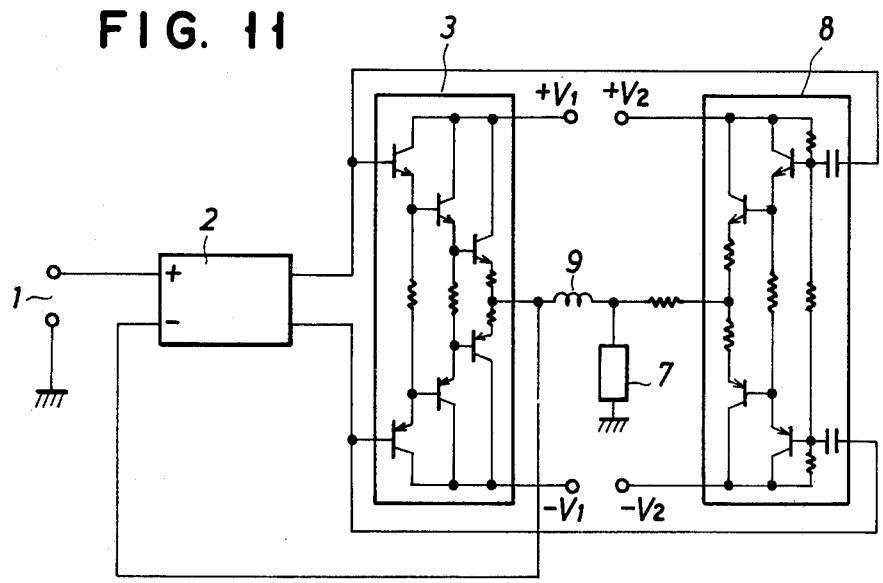
FIG. 11 is a view showing materialized circuits in which the summing circuit is formed by a part of the amplifier.

Further, the voltages and phases of the distortion compensating signals applied from the low power amplifier 8 may be adjusted not only by the impedance elements 9 and 10 inserted between the amplifiers 3 and 8 but also by the characteristic of the low power amplifier 8. FIG. 11 shows a circuit arrangement in which a voltage amplifier is used as the low power amplifier 8 and the capacitance in the voltage amplifier 8 is used as a part of the impedance element 10, with the resistance connected between the voltage amplifier 8 and the load 7. The low power amplifier 8 shown in FIG. 11 may be generally arranged as follows: The equation (18) is established when the gain of each of the amplifiers 3 and 8 is one, and providing that the gains of the amplifiers 3 and 8 are represented by $A_3$ and $A_4$, the equation (18) will result as follows:

$$Ab = \frac{X_o}{X_1 A_4} \quad (28)$$

Namely, the general characteristics of the circuits including the low power amplifiers 8 may be arranged so as to meet the equation (28).

Figure 12:
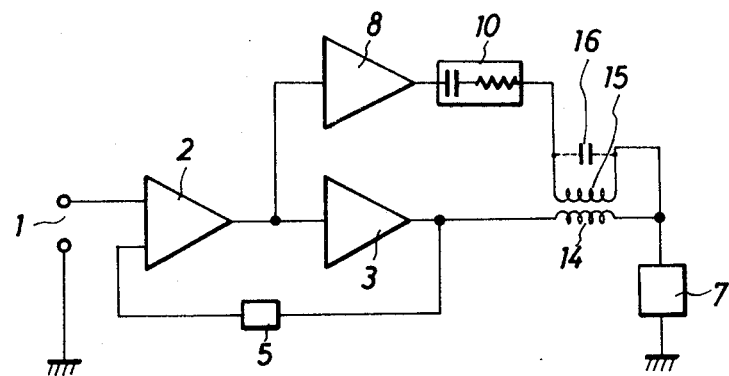
FIG. 12 is a circuit diagram showing a further embodiment of the present invention.

FIG. 12 shows another embodiment of the present invention wherein a first coil 14 is inserted between the high power amplifier 3 and the load 7 while a second coil 15 between the impedance element 10 and the load 7, and these first and second coils 14 and 15 are M-coupled each other at a predetermined coupling coefficient.

In the case of this arrangement, the outputs supplied from the high power amplifier 3 to the load 7 have the frequency characteristic of attenuating in the high frequency band due to the first coil 14. The signal appearing at the output point of the high power amplifier 3 is delayed in phase by the coil 14, while the output of the low power amplifier 8 advanced in phase by the impedance element 10 having the capacitance if the coil 15 is not used. Therefore, signal current is caused to flow between the high and low power amplifiers 3 and 8 as the frequency becomes higher. When this current increases, the distortion will be caused in the low power amplifier 8. For the purpose of avoiding this, the coil 15 is M-coupled to the coil 14, thus enabling the output phase of the low power amplifier 3 to be delayed over a limited frequency range. As the result, phase difference between the high and low power amplifiers 3 and 8 is made zero to thereby prevent distortion from being caused in the low power amplifier 8.

As shown by a dotted line in FIG. 12, the action of the M-coupling can be enhanced by a parallel resonance circuit in which a capacitance 16 is connected parallel to the second coil 15. "Q" of the resonance circuit may be lowered by connecting a resistance parallel to the second coil 15.

Figure 13:
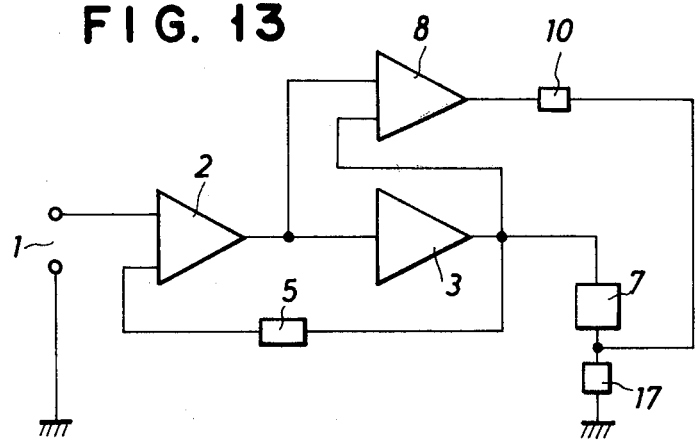
FIG. 13 is a block diagram showing still another embodiment of the present invention.

FIG. 13 shows a further embodiment of the present invention. The differential voltage between the input and output of the high power amplifier 3 i.e. the distortion signal is added to the low power amplifier 8, and an impedance element 17 is inserted on the earth potential side of the load 7. The outputs of the high power amplifier 3 are added to the load 7. The output current of the low power amplifier 8 is supplied through the impedance element 10 to the connecting point of the load 7 and the impedance element 17. In this case the outputs of the low and high power amplifiers 4 and 8 are adjusted in voltage and phase by the impedance elements 10 and 17 forming the summing circuit, and the distortion components caused by the high power amplifier 3 are cancelled by the compensating current supplied from the low power amplifier 8. In this case, as similar to the embodiment of the present invention shown in FIG. 2, the feedback amount of the output is arranged to reduce in the high frequency band for the purpose of enabling stable negative feedback to be attained, so that the distortion components contained in the outputs of the high power amplifier 3 increase as approaching toward the high frequency band. It is therefore necessary for the current for compensating the distortion components formed in the summing circuit to be arranged to increase as approaching toward the high frequency band. In view of this, a series circuit comprising a coil or a coil and a resistance may be used as the impedance element 17 connected on the earth potential side of the load 7, while a series or series-parallel circuit including a capacitance or a capacitance and resistance as the impedance element 10.

As described above in detail, the present invention provides an amplifying device capable of eliminating the distortion contained in the outputs of the high power amplifier in the high frequency band to obtain distortion-free outputs over a wide frequency range by combining the negative feedback circuit with the feedforward circuit and by selecting the impedance elements connected to the output terminals of the low and high power amplifiers.

What we claim is:

1. An amplifying device comprising a pre-amplifier, a first amplifier coupled to the output terminal of the pre-amplifier, a first impedance element coupled between the output terminal of the first amplifier and a load, a negative feedback circuit for feeding back the outputs of the first amplifier to the input of the pre-amplifier, a second amplifier coupled to the input terminal of the first amplifier, and a second impedance element coupled between the output terminal of the second amplifier and the load wherein the first and second impedance elements are selected so as to cancel the distortion caused in the first amplifier by the outputs of the second amplifier.

2. An amplifying device according to claim 1 wherein the first and second impedance elements are selected so as to cancel the distortion in the high frequency band.

3. An amplifying device according to the claim 1 wherein the second impedance element comprises a resistance coupled in series to a parallel circuit comprising a resistance and a capacitance.

4. An amplifying device according to the claim 1 wherein the second impedance element comprises a series circuit of a resistance and a capacitance.

5. An amplifying device according to the claim 1 wherein the second impedance element comprises a capacitance.

6. An amplifying device according to any one of the claims 1, 2, 3 and 4 wherein the first impedance element comprises a resistance and an inductance.

7. An amplifying device according to the claim 1 wherein the second impedance includes an inductance.

8. An amplifying device according to the claim 1 wherein the first impedance includes a capacitance.

9. An amplifying device according to the claim 1 wherein the first amplifier is a high power amplifier having relatively bad linearity and the second amplifier is a low power amplifier having relatively good linearity.

10. An amplifying device according to the claim 1 wherein the first impedance element is a first inductance, the second impedance element is coupled to a second inductance, and the first and second inductances are M-coupled each other, to thereby reduce the distortion contained in the outputs of the second amplifier.

11. An amplifying device comprising a pre-amplifier, a first amplifier for amplifying the outputs of the pre-amplifier, a first impedance element for applying the outputs of the first amplifier to a load, a negative feedback circuit for feeding back the outputs of the first amplifier to the input of the pre-amplifier, and a second amplifier for amplifying the inputs of the first amplifier and supplying the outputs through a second impedance element to the load to thereby cancel the distortion caused in the first amplifier.

12. An amplifying device according to one of the claims 1 and 11 wherein the first and second impedance elements are selected to meet the following equation:

$$\frac{X_o(s)}{X_1(s)} = A(s)b,$$

providing that the transfer function of a line extending from the first amplifier through the first impedance element to the load is represented by $X_o(s)$, that of a line extending from the second amplifier through the second impedance element to the load $X_1(s)$, that of the pre-amplifier by $A(s)$, and a constant of the negative feedback loop by $b$.

13. An amplifying device according to the claim 12 wherein the first impedance element comprises an inductance $L$ coupled to a resistance $R_4$, while the second impedance element comprises a resistance $R_1$ coupled to a parallel circuit of a resistance $R_2$ and a capacitance $C_1$, and the following conditions are selected:

$$\omega_1 = \frac{R_4}{L}, \omega_2 = \frac{1}{CR_2}, \omega_3 = \frac{1}{CR_1}, A_o b = \frac{R_2}{R_4},$$

in which $A_o$ represents the amplifying factor of the pre-amplifier.

14. An amplifying device according to one of the claims 1 and 11, wherein the difference in frequency characteristic between the first and second impedances is 12 dB/OCT or more.

15. A distortion correction circuit for a power amplifier comprising:
a first amplifier,
a second amplifier whose input receives a differential voltage between an input voltage of said first amplifier and an output voltage thereof,
a load connected to the output of said first amplifier,
a first impedance element connected between said load and the earth, and
a second impedance element connected between the output of said second amplifier and a connection node of the load and said first impedance element, thereby cancelling a distortion caused in said first amplifier.

16. A distortion correction circuit for a power amplifier comprising:
a pre-amplifier,
a first amplifier connected to the output terminal of said pre-amplifier,
a negative feedback circuit for feeding back the outputs of said first amplifier to the input of said pre-amplifier,
a second amplifier whose input receives a differential voltage between an input voltage of said first amplifier and an output voltage thereof,
a load connected to the output of said first amplifier,
a first impedance element connected between said load and the earth, and
a second impedance element connected between said second amplifier and a connection node of said load and said first impedance element, thereby cancelling a distortion caused in the first amplifier.

17. An amplifying device comprising:
a pre-amplifier,
a first amplifier for amplifying the outputs of said pre-amplifier,
a first impedance element for applying the outputs of said first amplifier to a load,
a negative feedback circuit for feeding back the outputs of said first amplifier to the input of said pre-amplifier, and
a second amplifier incorporating a second impedance element, for amplifying the input of said first amplifier and supplying the outputs through said second impedance element to the load to thereby cancel the distortion caused in said first amplifier.

18. An amplifying device comprising:
a pre-amplifier,
a first high power amplifier having relatively bad linearity and coupled to the output terminal of said pre-amplifier,
a first impedance element coupled between the output terminal of said first amplifier and a load,
a negative feedback circuit for feeding back the outputs of said first amplifier to the input of said pre-amplifier, and
a second low power amplifier having relatively good linearity and coupled to the input terminal of said first amplifier, said second amplifier being a voltage type amplifier and incorporating a second impedance element,
with said second impedance element coupled between the output terminal of said second amplifier and the load wherein said first and second impedance elements are selected so as to cancel the distortion caused in said first amplifier by the outputs of said second amplifier.

* * * * *